United States Patent
Suzuki et al.

(10) Patent No.: US 8,976,589 B2
(45) Date of Patent: Mar. 10, 2015

(54) STORAGE DEVICE

(71) Applicant: Kabushiki Kaisha Toshiba, Minato-ku (JP)

(72) Inventors: Riki Suzuki, Yokohama (JP); Shohei Asami, Yokohama (JP); Toshikatsu Hida, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 81 days.

(21) Appl. No.: 13/925,017

(22) Filed: Jun. 24, 2013

(65) Prior Publication Data

US 2014/0269072 A1      Sep. 18, 2014

Related U.S. Application Data

(60) Provisional application No. 61/783,650, filed on Mar. 14, 2013.

(51) Int. Cl.
*G11C 11/34* (2006.01)
*G11C 29/04* (2006.01)

(52) U.S. Cl.
CPC ...................................... *G11C 29/04* (2013.01)
USPC ............. 365/185.11; 365/185.18; 365/185.29

(58) Field of Classification Search
USPC ............................ 365/185.11, 185.18, 185.29
See application file for complete search history.

(56) References Cited

U.S. PATENT DOCUMENTS

| 5,844,847 | A | * | 12/1998 | Kobatake | 365/185.29 |
| 7,366,826 | B2 | * | 4/2008 | Gorobets et al. | 711/103 |
| 8,094,495 | B2 | * | 1/2012 | Toyama | 365/185.03 |
| 8,149,631 | B2 | * | 4/2012 | Shiino et al. | 365/185.29 |
| 2008/0140918 | A1 | | 6/2008 | Sutardja | |
| 2009/0129163 | A1 | | 5/2009 | Danilak | |
| 2011/0078402 | A1 | | 3/2011 | Sato | |

FOREIGN PATENT DOCUMENTS

| JP | 2009-64394 | 3/2009 |
| JP | 2010-512569 | 4/2010 |
| JP | 2010-152778 | 7/2010 |
| JP | 2011-503741 | 1/2011 |
| JP | 2011-70346 | 4/2011 |
| JP | 2011-159138 | 8/2011 |
| WO | WO 2008/073421 A2 | 6/2008 |
| WO | WO 2009/067139 A1 | 5/2009 |

* cited by examiner

*Primary Examiner* — Son Dinh
(74) *Attorney, Agent, or Firm* — Oblon, McClelland, Maier & Neustadt, L.L.P.

(57) ABSTRACT

According to one embodiment, a storage device includes a nonvolatile memory and a controller. The nonvolatile memory includes blocks which store data. Each of the blocks is an erase unit. The controller controls an operation of the nonvolatile memory. The controller executes writes and erases with respect to a first block of the blocks in the nonvolatile memory for the first number of times during a first period. The controller executes writes and erases with respect to other blocks for the second number of times smaller than the first number of times during the first period.

20 Claims, 12 Drawing Sheets

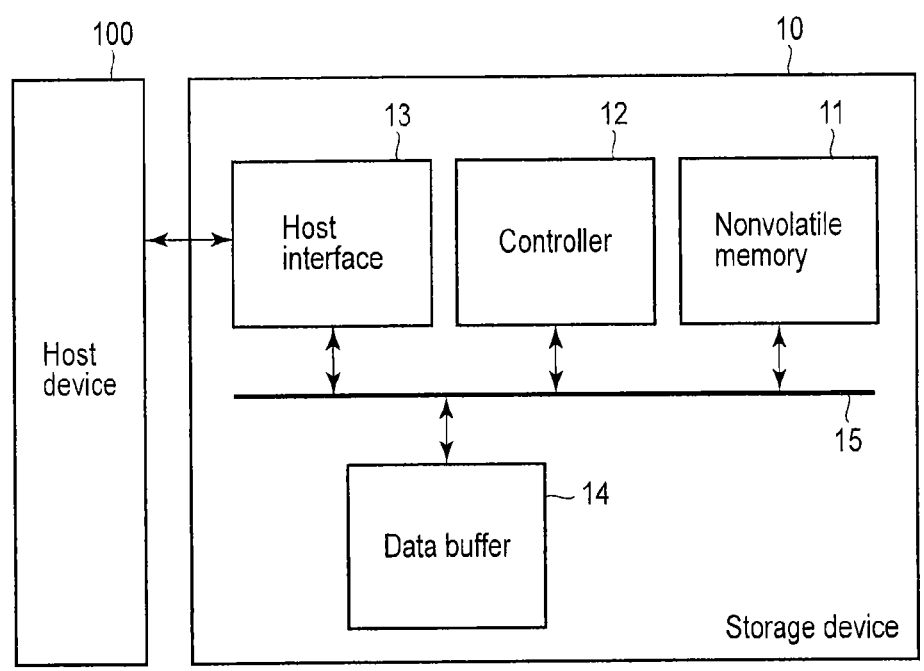
F I G. 1

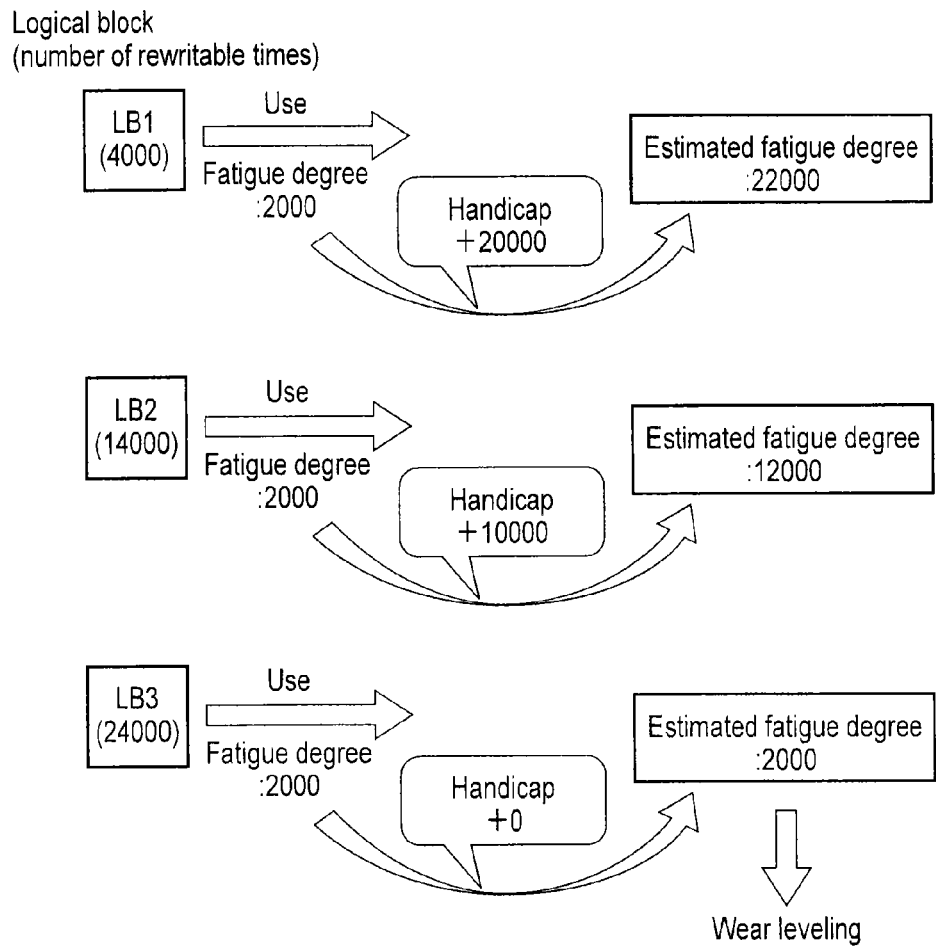
F I G. 6

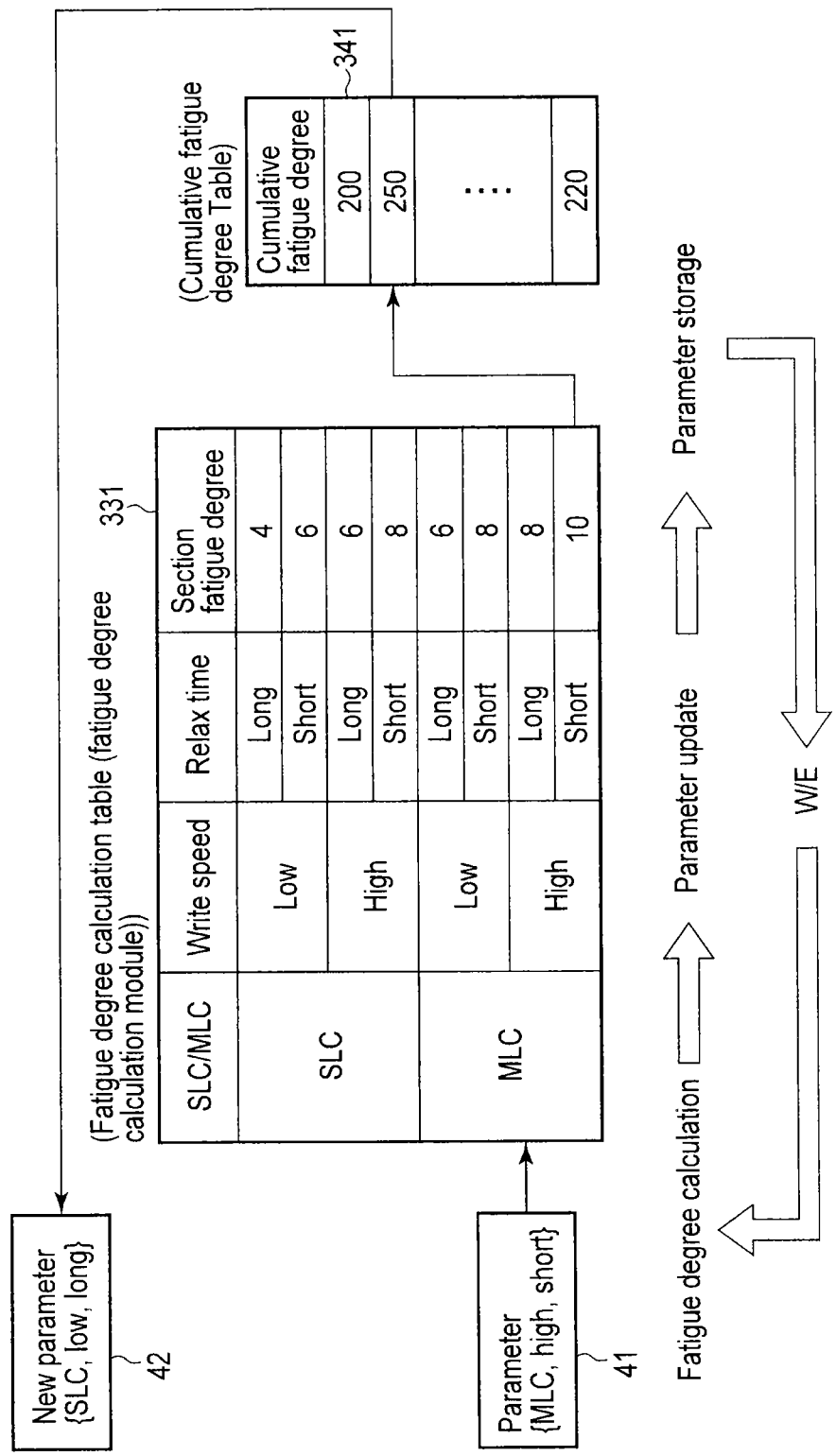
F I G. 14

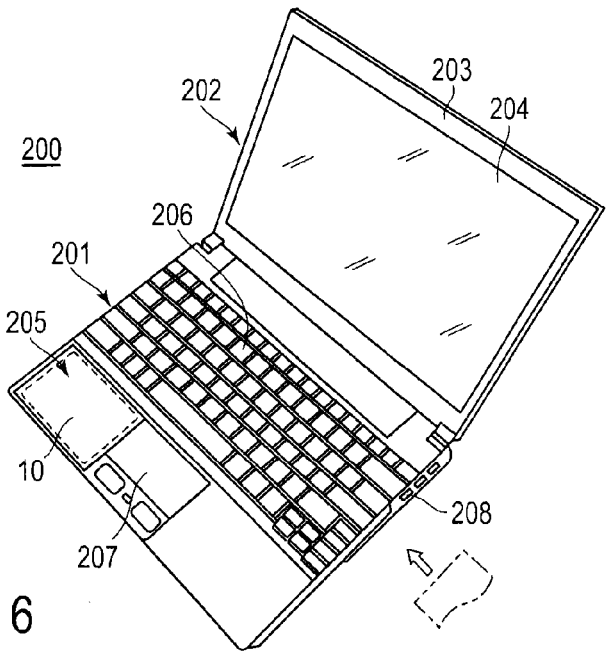
F I G. 1 6
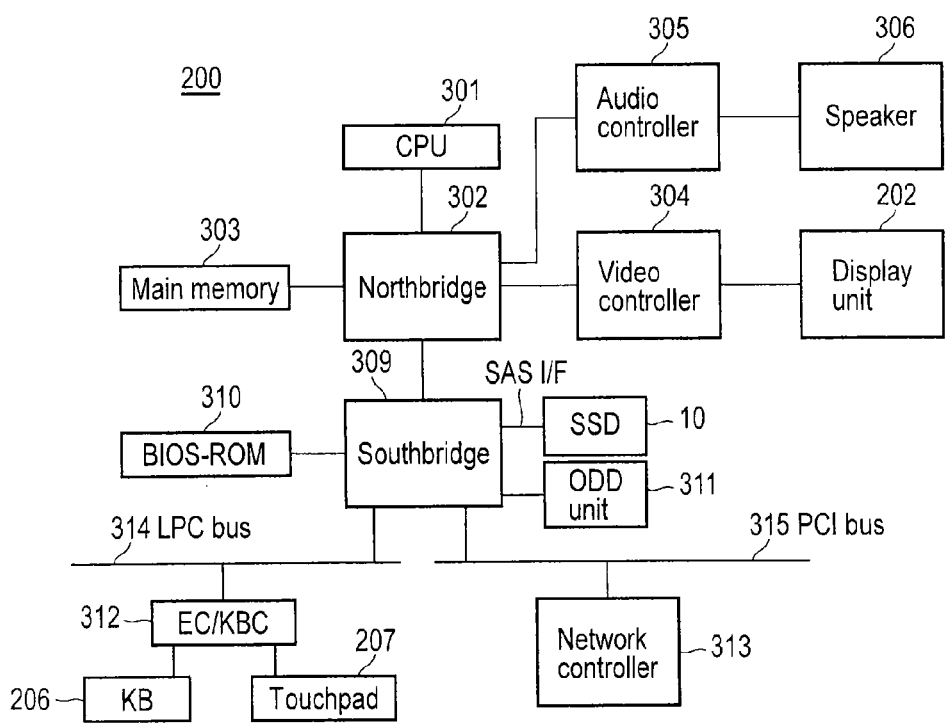
F I G. 1 7

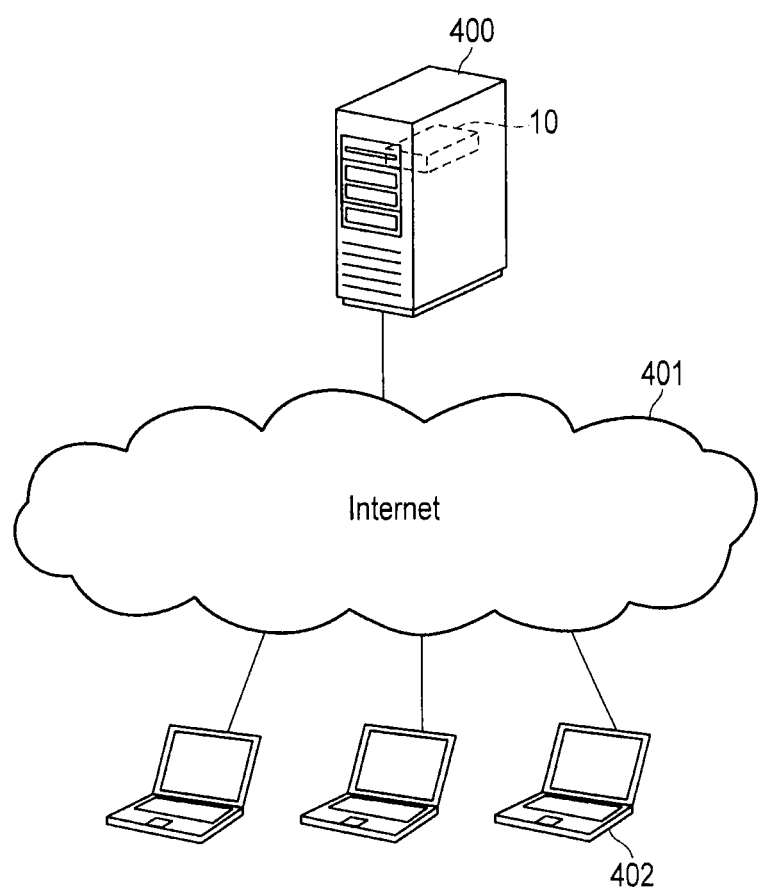
F I G. 18

US 8,976,589 B2

STORAGE DEVICE

CROSS-REFERENCE TO RELATED APPLICATIONS

This application claims the benefit of U.S. Provisional Application No. 61/783,650, filed Mar. 14, 2013, the entire contents of which are incorporated herein by reference.

FIELD

Embodiments described herein relate generally to a storage device including a nonvolatile memory.

BACKGROUND

In regard to a storage device using a NAND flash memory (which will be referred to as a NAND memory hereinafter) as a nonvolatile memory, for example, a solid-state drive (SSD) system, a demand for performance has recently become more rigorous. To enhance the performance while suppressing costs, developing a NAND controller that uses the NAND memory to a maximum extent will be more important in the future.

In the case of using the NAND memory that the number of rewritable (writable) times that varies depending on each chip or each block in a chip, to compress an amount of management information in a storage region, physical blocks may constitutes a block which is logical (which will be referred to as a logical block hereinafter) according to circumstances.

In this case, when physical block are randomly organized to constitute a logical block, a physical block having a considerably different number of rewritable times may be mixed in the logical block. In such a situation, since a defect occurs in dependent on a physical block having an extremely small number of rewritable times in the logical block, there is a problem that the defect occurs at an early point even though there is a physical block in which information can be still written as the NAND memory.

BRIEF DESCRIPTION OF THE DRAWINGS

FIG. 1 is a block diagram showing a configuration of a storage device according to a first embodiment;

FIG. 6 is a view showing a wear leveling method in the first embodiment;

FIG. 14 is a view showing a fatigue degree calculation table and a cumulative fatigue degree table according to the second embodiment;

FIG. 16 is a perspective view showing an example of a personal computer having an SSD mounted therein according to a third embodiment;

FIG. 17 is a block diagram showing a structural example of the personal computer having the SSD mounted therein according to the third embodiment; and FIG. 18 is a conceptual view showing a use example of a server having an SSD mounted therein according to a fourth embodiment.

DETAILED DESCRIPTION

Figure 2:
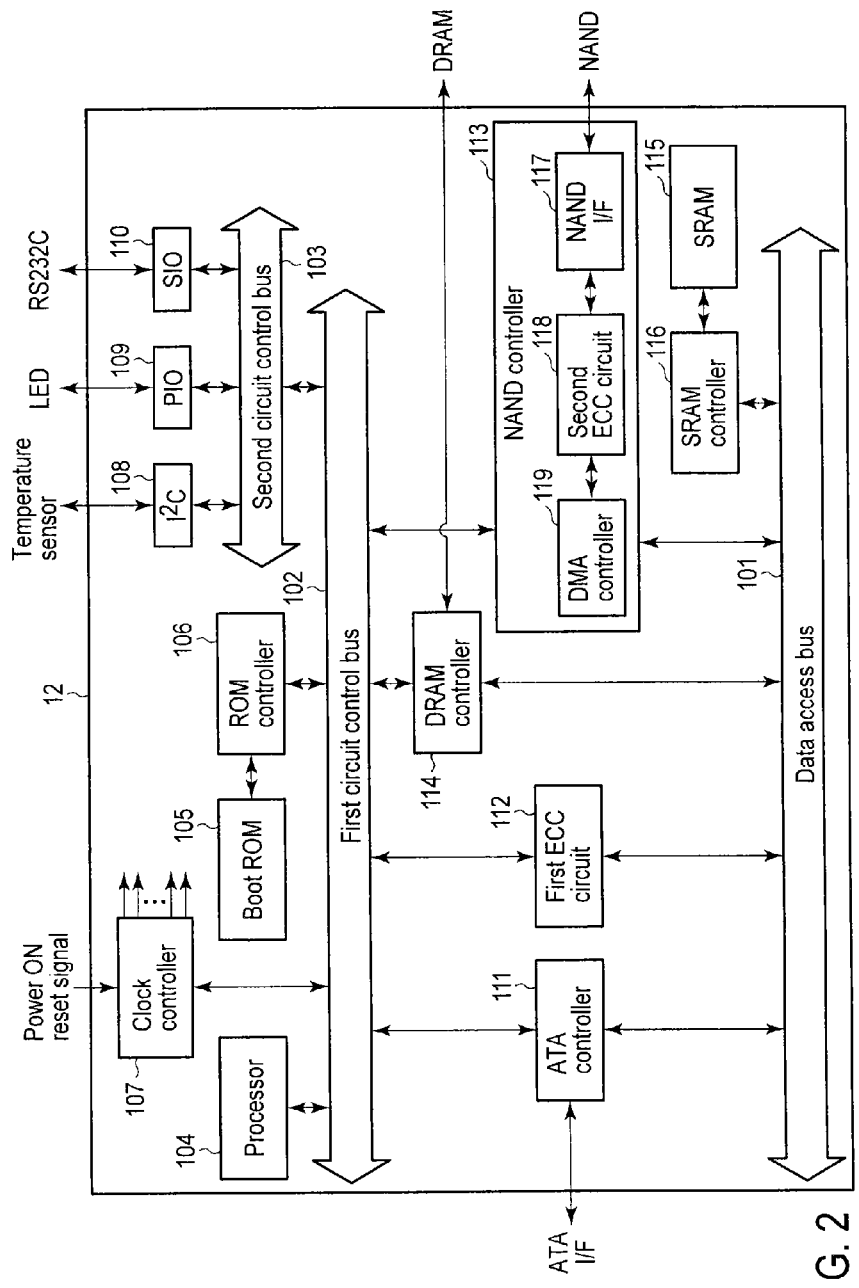
FIG. 2 is a block diagram showing an example of a controller 12 depicted in FIG. 1.

A storage device according to an embodiment will now be described hereinafter with reference to the drawings. It is to be noted that, in the following description, like reference numerals denote constituent elements having the same functions and structures, and overlapping explanation will be given only when necessary.

In general, according to one embodiment, a storage device includes a nonvolatile memory, a first storage unit, a second storage unit and a wear leveling control unit. The nonvolatile memory includes blocks which store data. Each of the blocks is an erase unit. The first storage unit stores the number of writes relative to each of the blocks in the nonvolatile memory. The number of writes is the number of times that each of the blocks is written. The second storage unit stores a handicap obtained for each of the blocks in the nonvolatile memory. The handicap is obtained by subtracting the number of writable times in each of the blocks from the number of writable times in a given block in the blocks. The wear leveling control unit adds each handicap to the number of writes in each of the blocks to obtain a fatigue degree of each of the blocks. The wear leveling control unit controls the number of writes performed with respect to each of the blocks so that the fatigue degrees are leveled. The fatigue degree represents a progress rate until each of the blocks reaches the number of writable times.

[First Embodiment]

The storage device includes, for example, an SSD, a Secure Digital (SD) card, a multimedia card, a USB flash memory, and others.

[1] Configuration of Storage Device

FIG. 1 is a block diagram showing a configuration of a storage device according to the first embodiment.

A storage device 10 includes a nonvolatile memory 11, a controller 12, a host interface 13, a data buffer 14, and others. A bus 15 electrically connects the nonvolatile memory 11, the controller 12, the interface control circuit 13, and the data buffer 14 to each other.

The nonvolatile memory 11 is accessed by a host 100 to read/write data, and it holds data even in a state that power is not supplied. The nonvolatile memory 11 includes a nonvolatile semiconductor memory, for example, a NAND flash memory (which will be referred to as a NAND memory hereinafter). The nonvolatile semiconductor memory is not restricted to the NAND flash memory, and it may include other nonvolatile semiconductor memories, for example, a NOR flash memory, a magnetic random access memory (MRAM), a resistive random access memory (ReRAM), a phase-change random access memory (PRAM), and others.

Furthermore, the nonvolatile semiconductor memory included in the nonvolatile memory 11 may be, for example, a single package including one or more semiconductor chips or may be packages each including one or more semiconductor chips. Moreover, the nonvolatile memory 11 may be any other nonvolatile memory, for example, a magnetic disk, a magnetic card, or a magnetic drum.

The controller 12 controls operations of the entire storage device, for example, the host interface 13, the nonvolatile memory 11, or the data buffer 14 in accordance with a signal input from the host 100 through the host interface 13 or a control program stored in the nonvolatile memory 11 or the data buffer 14.

The data buffer 14 is used for, for example, temporarily storing transfer data for the host 100 or the nonvolatile memory 11. Additionally, the data buffer 14 is also used for storage of management information in the nonvolatile memory 11 or as a data cache. The data buffer 14 includes, for example, a DRAM or an SRAM.

The host interface 13 is connected to the host 100 through a communication interface such as an Advanced Technology Attachment (ATA) interface, and it receives or transmits signals with respect to the host 100. The host 100 is an external device that writes and reads data with respect to the storage device 10, and it is constituted of, for example, a single unit such as a personal computer, a CPU core, or a server connected to a network or a combination of these members. Further, the storage device 10 functions as an external storage device of the host 100, for example.

Data transmitted from the host 100 to the host interface 13 is temporarily stored in the data buffer 14 under control of the controller 12. Then, the data is transferred from the data buffer 14 and written into the NAND memory in the nonvolatile memory 11. On the other hand, data read from the NAND memory in the nonvolatile memory 11 is temporarily stored in the data buffer 14. Thereafter, the data is transmitted to the host 100 from the data buffer 14 through the host interface 13.

[2] Configuration of Controller

FIG. 2 is a block diagram showing an example of the controller 12 depicted in FIG. 1.

The controller 12 includes a data access bus 101, a first circuit control bus 102, and a second circuit control bus 103. A processor 104 that controls the entire controller 12 is connected to the first circuit control bus 102. A boot ROM 105 is connected to the first circuit control bus 102 through an ROM controller 106. A boot program for booting each management program (FW: firmware) saved in the nonvolatile memory (the NAND flash memory) 11 is stored in the boot ROM 105.

Furthermore, a clock controller 107 is connected to the first circuit control bus 102. This clock controller 107 receives a power-on reset signal from a power supply circuit and supplies a reset signal and a clock signal to each unit.

The second circuit control bus 103 is connected to the first circuit control bus 102. To the second circuit control bus 103 are connected to an I²C circuit 108 configured to receive data from a temperature sensor, a parallel input/output (PIO) circuit 109 configured to supply a status indication signal to a state indication LED, and a serial input/output (SIO) circuit 110 configured to control an RS232C interface.

An ATA interface controller (an ATA controller) 111, a first error checking and correction (ECC) circuit 112, and a NAND controller 113 as a NAND flash memory controller, and a DRAM controller 114 are connected to both the data access bus 101 and the first circuit control bus 102. The ATA controller 111 transmits or receives data to or from the host 100 through the ATA interface. An SRAM 115 used as a data work area and a firmware expansion area is connected to the data access bus 101 through an SRAM controller 116. Firmware stored in the NAND flash memory is transferred to the SRAM 115 by the boot program stored in the boot ROM 105 at the time of startup.

The NAND controller 113 includes a NAND interface 117, a second ECC circuit 118, and a DMA transfer control DMA controller 119. The NAND interface 117 executes interface processing with respect to the NAND flash memory. The DMA transfer control DMA controller 119 executes access control between the NAND flash memory and the RAM (DRAM). The second ECC circuit 118 encodes a second error correction code, and also encodes and decodes a first error correction code. The first ECC circuit 112 decodes the second error correction code. The first error correction code and the second error correction code are, for example, a humming code, a Bose Chaudhuri Hocqenghem (BCH) code, a Reed Solomon (RS) code, or a low-density parity check (LDPC), or the like. A correction capability of the second error correction code is determined to be higher than a correction capability of the first error correction code.

[3] Wear Leveling Using Handicap

As miniaturization of the NAND memory advances, an endurance of the NAND memory is becoming insufficient. Thus, technology that efficiently uses a storage region as much as possible is demanded. In this embodiment, a description will be given as to a technique that provides a handicap with respect to differences in rewrite life duration (or the number of rewritable times or the number of rewrite limiting times) between chips or blocks in a chip so that all blocks can be evaluated in terms of the rewrite life duration and thereby efficiently uses all the blocks as far as possible.

It is to be noted that a chip (or a semiconductor chip) is a small piece of a semiconductor substrate on which, for example, the NAND memory is formed. Further, the block is an erase unit in a given storage capacity and includes a physical block and a logical block. The rewrite means write and erase performed with respect to a block. The handicap is a difference in rewrite life duration (or the number of rewritable times) between chips or blocks in a chip, and it is obtained by subtracting each number of rewritable times from the maximum number of rewritable times here.

A configuration of a functional block included in the storage device according to the first embodiment will now be described, and a logical block configuring method, a handicap deciding method, and a wear leveling method will be also explained.

(1) Configuration of Functional Block

Figure 3:
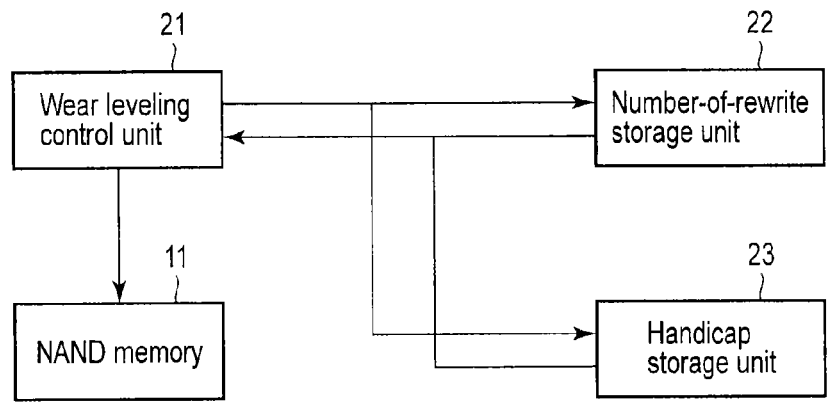
FIG. 3 is a view of a functional block included in the storage device according to the first embodiment.

FIG. 3 is a block diagram showing a configuration in the storage device required to perform wear leveling according to this embodiment.

The storage device according to this embodiment includes a wear leveling control unit 21, a number-of-rewrite storage unit 22, a handicap storage unit 23, and the NAND memory 11. The number-of-rewrite storage unit 22 stores a number-of-rewrite storage table, and the handicap storage unit 23 stores a handicap storage table.

The controller 12 in the storage device 10 shown in FIG. 1 includes the wear leveling control unit 21. The data buffer 14 has the number-of-rewrite storage unit 22 and the handicap storage unit 23. That is, the data buffer 14 stores the number-of-rewrite storage table and the handicap storage table.

It is to be noted that the NAND memory 11 may have the number-of-rewrite storage unit 22 and the handicap storage unit 23 to store the number-of-rewrite storage table and the handicap storage table. In this case, the number-of-rewrite storage table and the handicap storage table are read of the NAND memory 11 at the time of starting up the storage device 10, and these tables may be held in the data buffer 14.

The number-of-rewrite storage table stores the number of already executed rewrites in accordance with each block in the NAND memory 11. The handicap storage table stores a handicap in accordance with each block in the NAND memory.

The wear leveling control unit 21 uses the number of rewrites stored in the number-of-rewrite storage table in the number-of-rewrite storage unit 22 and a handicap stored in the handicap storage table in the handicap storage unit 23 and obtains an estimated fatigue degree (or the estimated number of rewrites). For example, the wear leveling control unit 21 adds the number of rewrites and a handicap to calculate an estimated fatigue degree in accordance with each block in the NAND memory 11. The wear leveling control unit 21 adjusts the number of rewrites which is to be effected with respect to each block so that estimated fatigue degrees can be leveled among blocks based on the estimated fatigue degrees.

The NAND memory has the number of rewritable times (rewrite life duration), fatigue proceeds as the number of rewrites increases, and the number of rewrites gradually approximates the number of rewritable times. The fatigue degree (the estimated fatigue degree) means this fatigue level. In other words, the fatigue degree represents a progress rate until each of the blocks reaches the number of rewritable times.

It is to be noted that the number-of-rewrite storage unit (the number-of-rewrite storage table) 22 and the handicap storage unit (the handicap storage table) 23 are separately provided here, but these units may be configured as one storage unit (one table). That is, a previously obtained handicap may be added to the number of rewrites to acquire an estimated fatigue degree, and this estimated fatigue degree may be stored in one storage unit. In this case, the handicap storage unit (the handicap storage table) may be eliminated.

(2) Logical Block Configuring Method

In the NAND memory, to compress a management information amount of each block, physical blocks in the NAND memory are put together to form a logical block. The logical block is a write and erase unit.

Figure 4:
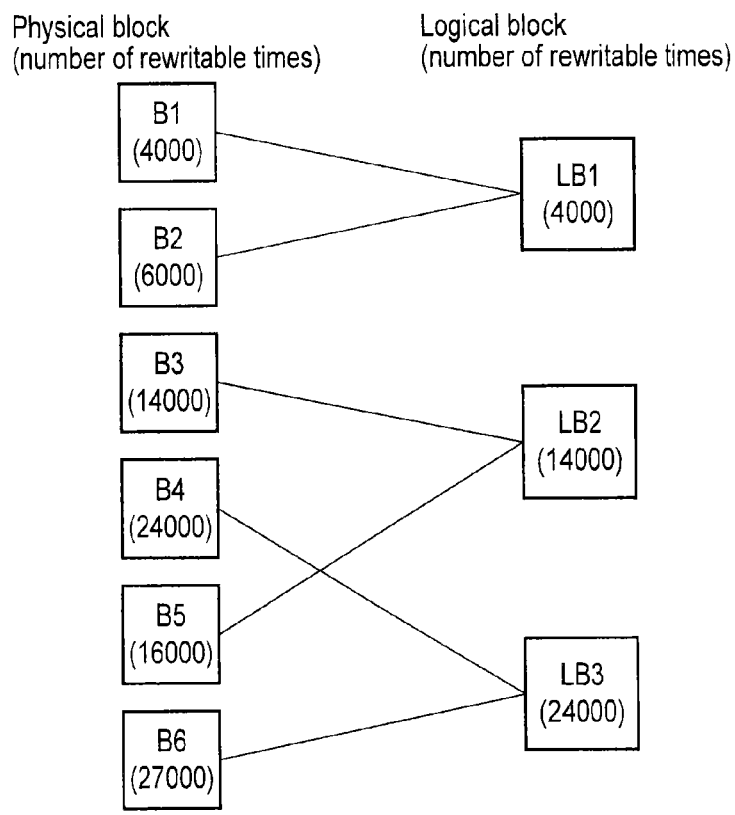
FIG. 4 is a view showing a logical block configuring method in the first embodiment.

FIG. 4 is a view showing the logical block configuring method according to the first embodiment.

At the time of configuring a logical block, the logical block is configured by the following method. First, the number of rewritable times is obtained in accordance with each physical block. For example, as shown in FIG. 4, it is assumed that the numbers of rewritable times of physical blocks B1 to B6 are 4000, 6000, 14000, 24000, 16000, and 27000, respectively.

In this case, the physical blocks having the numbers of rewritable times which are close to each other are put together to form the logical block. For example, since physical block B1 has a value 4000 as the number of rewritable times and physical block B2 has a value 6000 as the number of rewritable times, these physical blocks are put together as one, and a logical block LB1 is formed. At this time, the number of rewritable times of logical block LB1 is 4000.

Moreover, since physical block B3 has a value 14000 as the number of rewritable times and physical block B5 has a value 16000 as the number of rewritable times, these physical blocks are put together as one, and a logical block LB2 is formed. At this time, the number of rewritable times of logical block LB2 is 14000.

Additionally, since physical block B4 has a value 24000 as the number of rewritable times and physical block B6 has a value 27000 as the number of rewritable times, these physical blocks are put together as one, and a logical block LB3 is formed. At this time, the number of rewritable times of logical block LB3 is 24000.

In this manner, when the physical blocks having the numbers of rewritable times which are close to each other are put together as one to form a logical block, there is no large difference in number of rewritable times between the physical blocks in the logical block even though this embodiment is executed while targeting the logical block, the number of rewritable times to be wasted can be reduced, and a sufficient effect can be obtained.

A method of measuring the number of rewritable times in each block will now be described.

Before configuring a logical block, there is a tendency in error occurrence rate depending on a position of each physical block in the NAND memory (the chip). Therefore, when the tendency in error occurrence rate depending on a position of the physical block is used, the position of the physical block and the remaining number of rewritable times can be associated with each other.

Further, after configuring the logical block, an error occurrence rate after executing write and erase (W/E) with respect to the logical block is used. For example, a bit error rate (BER) is measured as the error occurrence rate in accordance with a predetermined cycle of write and erase with respect to the logical block. As a result, the remaining number of rewritable times is estimated based on a ratio that BER as end of life duration is reached and the number of write and erase cycles at a current time point. Here, the bit error rate (BER) means a rate of the number of error bits relative to first data when the first data is written in each of the logical blocks and the first data is read. Furthermore, the embodiment is not restricted to the logical block, BER may be obtained with respect to each of the physical blocks, these BERs may be used.

(3) Handicap Deciding Method

It can be considered that the endurance (the number of rewritable times) of the blocks have dependency in accordance with each physical position of each block in the NAND memory (the chip).

Thus, for example, in a test process, blocks placed at a common physical position are extracted from chips, and a write and erase cycle test is conducted. Furthermore, a difference between numbers of writes and erases until BER as life duration is reached is determined as a handicap of the chips. Moreover, based on the handicap of the chips, a handicap of each physical block is determined by using a position of the physical block in each chip.

Figure 5:
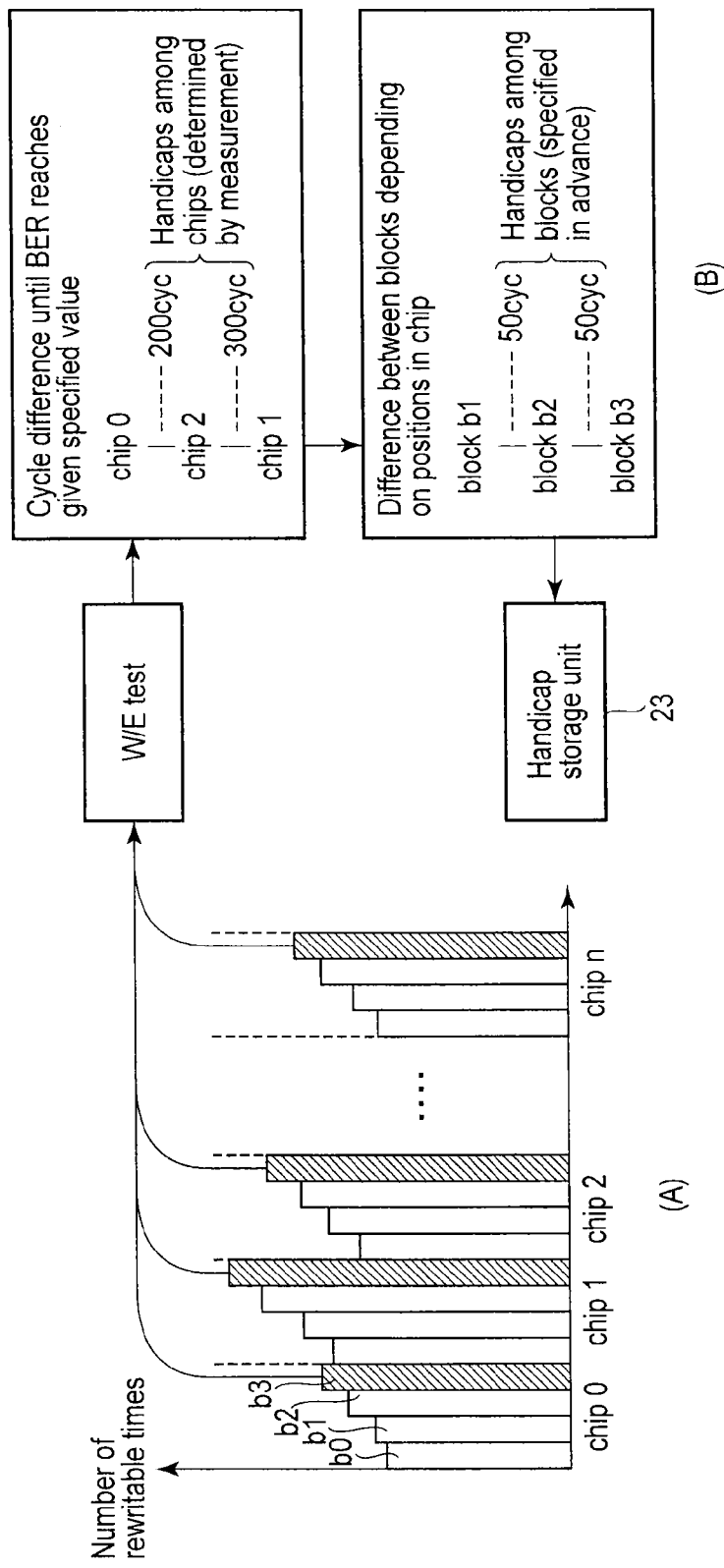
FIG. 5 is a view showing a handicap deciding method in the first embodiment.

FIG. 5 is a view showing the handicap deciding method according to the first embodiment.

As shown in FIG. 5(A), the number of rewritable times obtained by the write and erase cycle test varies depending on each of chips 0, 1, 2, ..., n (n is a natural number that is not less than 0), and it also varies depending on each of blocks b0, b1, b2, and b3 in a chip.

For example, in the write and erase cycle test for block b3 in each of chips 0, 1, 2, ..., n, a difference between the numbers of writes and erases until the BER reaches a specified value is a handicap of the chips. Here, a difference between the maximum number of rewritable times and the number of rewritable times of each chip is determined as a handicap. As shown in FIG. 5(B), for example, it is assumed that, after the BER of chip 0 reaches a specified value, there is a difference of 200 times until the BER of chip 2 reaches the specified value, and thereafter there is a difference of 300 times until the BER of chip 1 reaches the specified value. In this case, the handicap of chip 0 is 500, the handicap of chip 2 is 300, and the handicap of chip 1 is 0.

Additionally, the handicap of each block in the chip is obtained as follows, for example. Based on positional information of each physical block in the chip, the number of rewritable times of each block is estimated. Further, a difference between the estimated maximum number of rewritable times and the estimated number of rewritable times of each block is determined as the handicap.

As shown in FIG. 5(B), for example, it is assumed that the estimated number of rewritable times of block b2 is higher than that of block b1 and its difference is 50 times and that the estimated number of rewritable times of block b3 is higher than that of block b2 and its difference is 50 times. In this case, if the estimated number of rewritable times of block b3 is maximum, the handicap of block b1 is 100, the handicap of block 2b is 50, and the handicap of block b3 is 0. Then, the obtained handicaps are stored in the handicap storage table in the handicap storage unit 23.

(4) Wear Leveling Method

FIG. 6 is a view showing the wear leveling method according to the first embodiment.

As shown in the drawing, the numbers of rewritable times in logical blocks LB1, LB2, and LB3 are calculated by obtaining the number of write and erase cycles until the BER of each logical block reaches a specified value. Here, the numbers of rewritable times in logical blocks LB1, LB2, and LB3 are 4000, 14000, and 24000, respectively.

A use fatigue degree is the number of rewrites already executed with respect to each of logical blocks LB1, LB2, and LB3. Here, the numbers of rewrites already executed with respect to logical blocks LB1, LB2, and LB3 are all 2000.

The handicap is obtained by subtracting the number of rewritable times in each logical block from the maximum number of rewritable times in the numbers of rewritable times obtained for logical blocks LB1, LB2, and LB3. Here, the handicaps in logical blocks LB1, LB2, and LB3 are 20000, 10000, and 0, respectively.

When the handicap is added to the use fatigue degree (the number of rewrites), an estimated fatigue degree (a cumulative fatigue degree) in each of logical blocks LB1, LB2, and LB3 is calculated. Here, the estimated fatigue degrees in logical blocks LB1, LB2, and LB3 are 22000, 12000, and 2000, respectively.

The wear leveling control unit adjusts the number of rewrites which are executed to each of logical blocks LB1, LB2, and LB3 based on each estimated fatigue degree obtained by adding the handicap as a weight to each use fatigue degree, and it levels the estimated fatigue degrees. This unit increases a frequency that logical block LB3 is used and levels the estimated fatigue degrees in logical blocks LB1, LB2, and LB3.

As a result, the numbers of rewrites that can be executed relative to logical blocks LB1, LB2, and LB3 are increased so that all the logical blocks can be effectively used.

Figure 7:
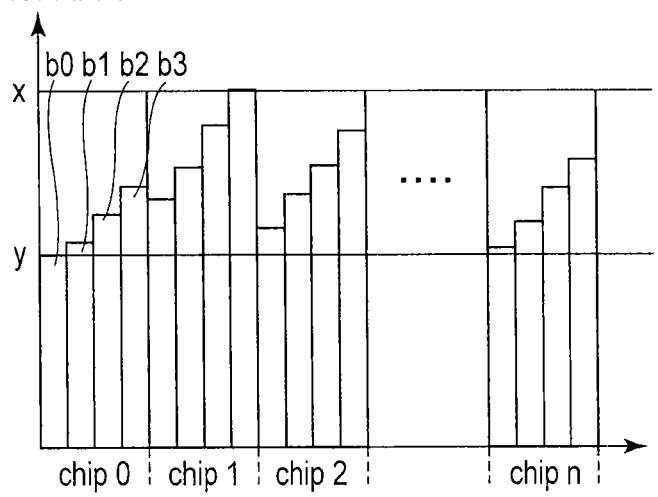
FIG. 7 is a view showing the number of rewritable times in a NAND memory.
Figure 8:
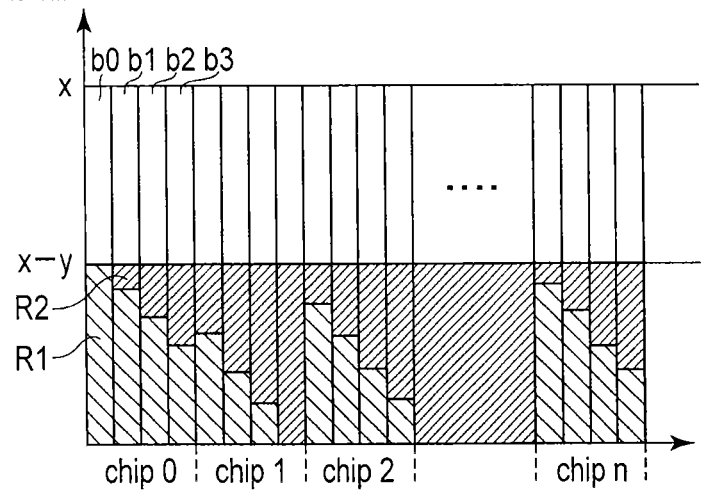
FIG. 8 is a view showing effects of the wear leveling in the first embodiment.

FIG. 7 is a view showing the numbers of rewritable times in the NAND memory, and FIG. 8 is a view showing an effect of the wear leveling in the first embodiment.

For example, it is assumed that the numbers of rewritable times in chip 0, 1, 2, ..., n are as shown in FIG. 7. x represents a maximum value of the number of rewritable times in each block, and y represents a minimum value of the number of rewritable times in each block. The handicap is calculated by subtracting the number of rewritable times in each block from the maximum value x of the number of rewritable times.

FIG. 8 is a view in which each obtained handicap is added to the number of rewritable times in each block. An x axis represents the apparent number of rewrites, and a region R1 represents the handicap. A region R2 represents the number of rewritable times that can be increased in this embodiment, and it can be obtained from the expression (x−y)*(the number of blocks)−(a sum total of the handicaps).

In the first embodiment, since each block having a large handicap added thereto is treated as a block having the large number of rewrites (or the large number of erases), its frequency is lower than that of a block having a small handicap. Conversely, since a block having a small handicap is treated as a block having the small number of rewrites, its frequency can be increased beyond that of a block having a large handicap.

As a result, the wear leveling is appropriately carried out, namely, each block having the large number of rewritable times is used on a priority basis, and each block having the small number of rewritable times is prevented from being used as much as possible, thereby leveling the numbers of rewritable times in the blocks. Consequently, the blocks can be used up to the limit of the numbers of rewritable times in the respective blocks, and all the blocks can be effectively used.

In this embodiment, the numbers of rewritable times in all blocks are obtained, and the handicaps are acquired from the numbers of rewritable times. Furthermore, each handicap is added to each number of already executed writes, and the estimated number of rewrites (the estimated fatigue degree) in each block is obtained. When this estimated number of rewrites is used, the conventional wear leveling technique using the numbers of rewrites can be utilized as it is. It is to be noted that the wear leveling technique for the logical blocks has been described in this embodiment, but the wear leveling technique according to this embodiment can be also used for the physical blocks.

[Second Embodiment]

In a second embodiment, a description will be given as to a wear leveling technique for leveling actual fatigue degrees in blocks. In conventional examples, the wear leveling mainly taking the numbers of rewrites (or the numbers of erases) alone into consideration is carried out, and a difference between fatigue degrees due to, for example, use of memory cells included in each block is not considered. However, evaluation experiments have revealed a difference between fatigue degrees when each memory cell is used as a single-level cell (SLC)/multi-level cell (MLC) or a change in fatigue degree depending on a write speed. In this embodiment, a description will be given as to the wear leveling technique based on a fatigue degree which is produced depending on a difference in use conditions between blocks. In the single-level cell (SLC), data of a single bit is recorded in one memory cell. In the multi-level cell (MLC), data of two bits or more is recorded in one memory cell.

In this embodiment, a description will be given on a technique that further efficiently uses the NAND flash memory by carrying out the wear leveling using a fatigue degree due to a difference in use conditions between blocks in place of the conventional wear leveling using the numbers of writes (the number of erases).

Configurations of a storage device and a controller in the second embodiment are equal to the configurations of the storage device 10 and the controller 12 depicted in FIGS. 1 and 2 in the first embodiment, and hence a description thereof will be omitted.

A configuration of a functional block included in the storage device according to the second embodiment will be explained, and a tendency of a fatigue degree, control over a cumulative fatigue degree, parameterization of a fatigue degree, dynamic control, and a flowchart of an operation will be also described.

(1) Configuration of Functional Block

Figure 9:
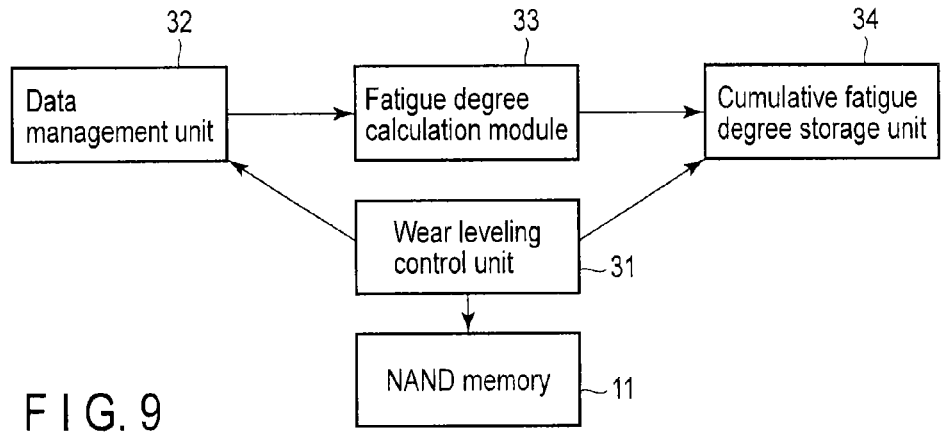
FIG. 9 is a view of a functional block included in a storage device according to a second embodiment.

FIG. 9 is a block diagram showing a configuration included in the storage device in order to execute the wear leveling according to this embodiment.

The storage device according to this embodiment includes a wear leveling control unit 31, a data management unit 32, a fatigue degree calculation module 33, a cumulative fatigue degree storage unit 34, and a NAND memory 11.

The data management unit 32 stores and manages use information of the NAND memory 11 as described above. The fatigue degree calculation module 33 stores a fatigue degree calculation table, and the cumulative fatigue degree storage unit 34 stores a cumulative fatigue degree table.

The controller 12 in the storage device 10 shown in FIG. 1 includes the wear leveling control unit 31. The data buffer 14 includes the data management unit 32, the fatigue degree calculation module 33, and the cumulative fatigue degree storage unit 34. That is, the data buffer 14 stores the fatigue degree calculation table and the cumulative fatigue degree table.

It is to be noted that the NAND memory 11 may have the data management unit 32, the fatigue calculation module 33, and the cumulative fatigue degree storage unit 34 and store the use information, the fatigue degree calculation table, and the cumulative fatigue degree table. In this case, the use information, the fatigue degree calculation table, and the cumulative fatigue degree table may be read of the NAND memory 11 and held in the data buffer 14 at the time of starting up the storage device 10.

The data management unit 32 stores and manages the use information of the NAND memory 11 as described above. The use information includes information indicative of which one of SLC/MLC a memory cell included in a block is used as, an interval of writes (a relax time) relative to a block, a write speed with respect to a block, and others.

The fatigue degree calculation module 33 calculates a fatigue degree of each block based on the use information of the NAND memory 11 stored in the data management unit 32. The fatigue degree represents an amount of fatigue caused in each block when each block is used based on the use information. The cumulative fatigue degree storage unit 34 cumulatively adds the fatigue degree calculated by the fatigue degree calculation module 33 in accordance with each block and obtains a cumulative fatigue degree. Further, the obtained cumulative fatigue degree is stored in a cumulative fatigue degree table.

The wear leveling control unit 31 performs the wear leveling for adjusting a use frequency of each block based on the cumulative fatigue degree stored in the cumulative fatigue degree table, namely, it allows each block having a small cumulative fatigue degree to be used on a priority basis or prevents each block having a large cumulative fatigue degree from being used as much as possible so that the cumulative fatigue degrees in the blocks can be leveled. Then, the wear leveling control unit 31 outputs new use information of the blocks to the data management unit 32.

(2) Tendency of Fatigue Degree and Control Over Cumulative Fatigue Degree

Progress of the fatigue degree caused in each block differs depending on use conditions, for example, which one of SLC/MLC each memory cell in each block is used as (a use), the interval of writes (the relax time) relative to each block, the write speed with respect to each block, and others.

Figure 10:
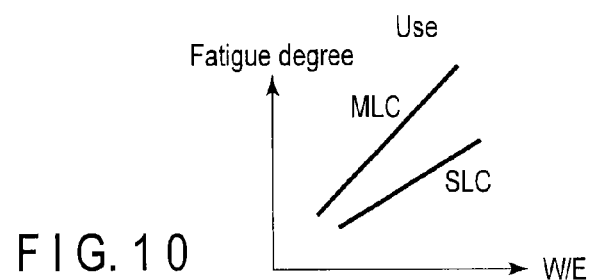
FIGS. 10 to 12 are views showing a tendency of a fatigue degree depending on use conditions of a NAND memory.
Figure 11:
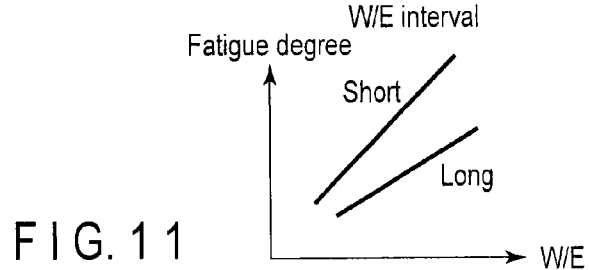
Figure 12:
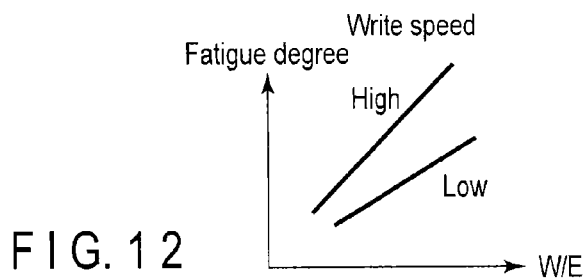

Each of FIGS. 10 to 12 is a view showing a tendency of the fatigue degree that appears depending on use conditions of the NAND memory.

The progress of the fatigue degree differs depending on which one of SLC/MLC each cell in each block is used and, when a memory cell is used as an MLC as shown in FIG. 10, the progress of the fatigue degree becomes considerable as compared with a case where the memory cell is used as an SLC.

Furthermore, as shown in FIG. 11, when the interval of writes relative to each block is short, the fatigue degree largely progresses as compared with a case where the interval of the writes is long. Moreover, as shown in FIG. 12, when the write speed with respect to each block is high, the fatigue degree greatly progresses as compared with a case where the write speed is low.

Figure 13:
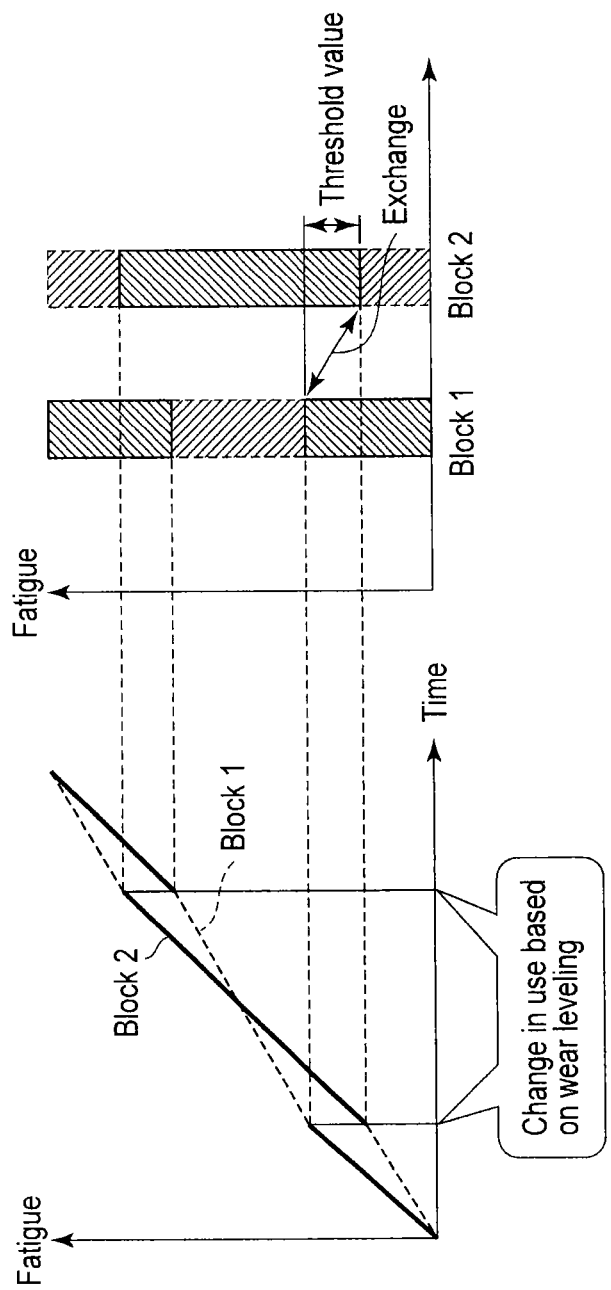
FIG. 13 is a view showing an example of control over a cumulative fatigue degree in the NAND memory according to the second embodiment.

FIG. 13 shows an example of control over the cumulative fatigue degree in the NAND memory.

A broken line portion represents a case where each of blocks 1 and 2 is used under use conditions that the fatigue degree slowly progresses, and a solid line portion represents a case where the same is used under conditions that the fatigue degree rapidly progresses.

For example, when the fatigue degree of block 1 is increased and the fatigue degree of block 1 is higher than the fatigue degree of block 2 by a predetermined threshold value, at least one of the block use, the interval of writes, and the write speed of block 1 is changed with a counterpart of block 2. As a result, the progress of the fatigue degree in block 1 is slowed down.

Thereafter, when the fatigue degree of block 2 is increased and the fatigue degree of block 2 is higher than the fatigue degree of block 1 by a predetermined threshold value, at least one of the block use, the interval of writes, and the write speed of block 2 is likewise changed with a counterpart of block 1. As a result, the progress of the fatigue degree in block 2 is slowed down. When the cumulative fatigue degree is controlled in this manner, the fatigue degrees in blocks 1 and 2 are leveled.

As described above, changing at least one of the block use, the interval of writes, and the write speed enables leveling the cumulative fatigue degrees of the blocks in the NAND memory 1.

(3) Parameterization of Block Use Information and Dynamic Control

The use information of each block is set as a parameter, and the fatigue degree caused by rewrite (use) of the block is obtained in accordance with each block. The fatigue degree is cumulated every time rewrite is performed with respect to each block, and it is stored as a cumulative fatigue degree in the cumulative fatigue degree table in the cumulative fatigue degree storage unit 34.

FIG. 14 is a view showing the fatigue degree calculation table in the fatigue degree calculation module 33 and the cumulative fatigue degree table in the cumulative fatigue degree storage unit 34.

The fatigue degree calculation table 331 shows each section fatigue degree when the user information is set as a parameter. That is, the section fatigue degree is decided as, for example, one of 4, 6, 8, and 10 in accordance with use conditions, i.e., which one of SLC and MLC a memory cell corresponds to, an interval of writes (a relax time) is long or short, and a write speed is low or high as the use information of each block.

The cumulative fatigue degree table 341 cumulates and stores the fatigue degree obtained from the fatigue degree calculation table 331 in accordance with each block.

For example, it is assumed that data is written and erased (rewritten) in a block in the NAND memory 11 under use conditions represented by a parameter 41. The use conditions represented by the parameter 41 are that a memory cell is used as the MLC, a write speed is high, and an interval of writes is short.

At this time, it is assumed that a section fatigue degree obtained in accordance with the use conditions of the block is 10. The section fatigue degree is added to a cumulative fatigue degree in the cumulative fatigue degree table 341, and the cumulative fatigue degree is 250.

When the difference in the cumulative fatigue degree stored in the cumulative fatigue degree table 341 is not smaller than a predetermined threshold value, the wear leveling control unit 31 updates the parameter 41 to a new parameter 42. Further, the wear leveling control unit 31 performs write and erase (rewrite) with respect to the block which is a use target under use conditions represented by the new parameter 42. Then, when the write and erase are again executed, calculation of the cumulative fatigue degree, update of the parameter, and storage are repeated.

As described above, when a block having a high cumulative fatigue degree is used under use conditions having a small section fatigue degree, progress of the fatigue degree is suppressed, and the cumulative fatigue degree in the block is leveled. It is to be noted that the fatigue degree is obtained by using the use conditions of the block, i.e., which one of an SLC cell and an MLC cell each memory cell corresponds to, whether an interval of writes (a relax time) is long or short, and whether a write speed is low or high in this example, but the embodiment is not restricted thereto, and the section fatigue degree and the cumulative fatigue degree may be obtained by using other use conditions that provide each block with a fatigue degree.

(4) Operation of Wear Leveling

Figure 15:
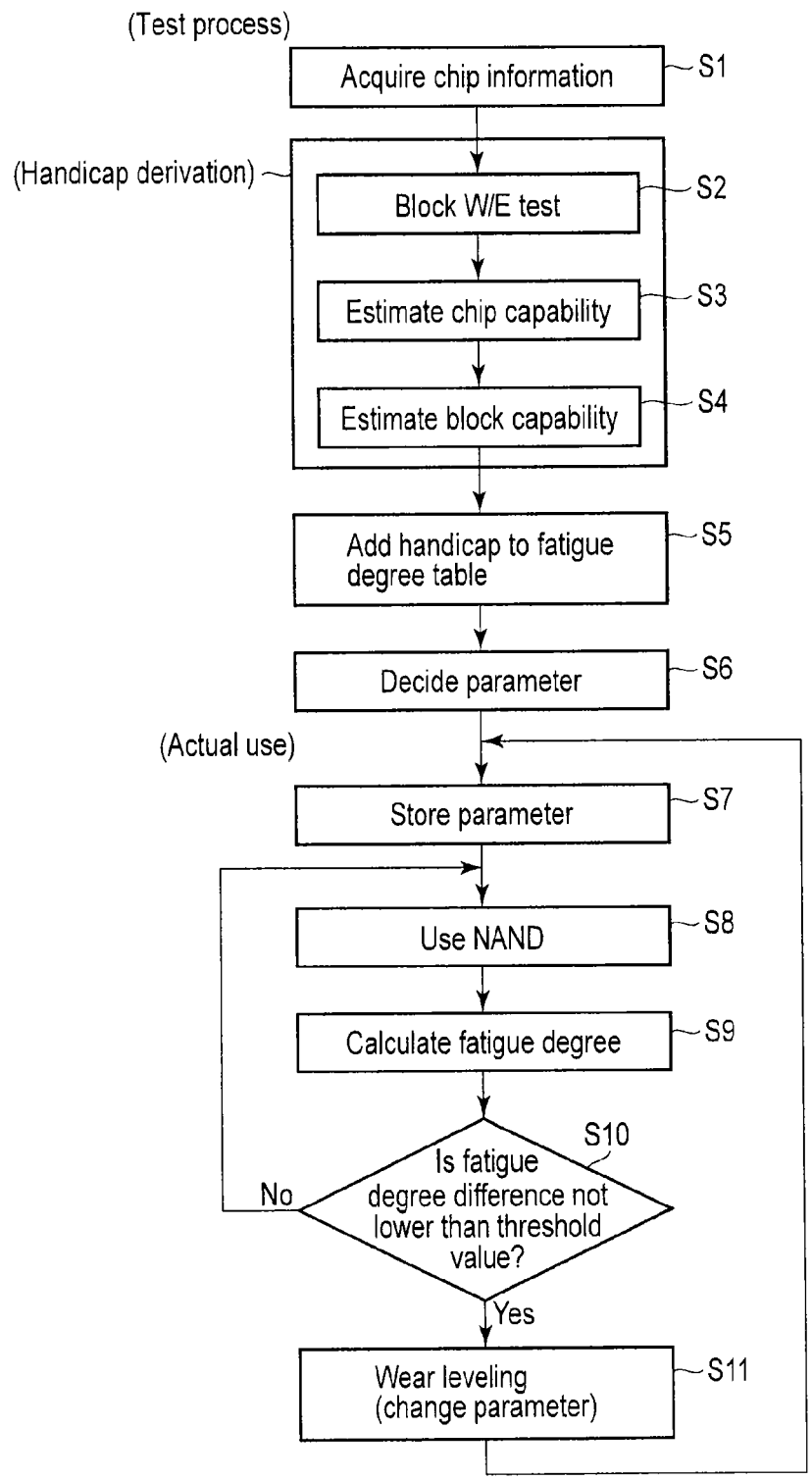
FIG. 15 is a flowchart showing an example of a wear leveling operation as a combination of the first and second embodiments.

FIG. 15 is a flowchart showing an example of an operation of the wear leveling according to a combination of the first and second embodiments. The operation of this flowchart is controlled by the controller 12, or the wear leveling control units 21 and 31, or an external control circuit.

The number of rewritable times in each block in the NAND memory 11 varies depending on a position of the NAND memory 11 on a wafer. Therefore, positional information of the NAND memory (chip) 11 on the wafer is first acquired (step S1).

Then, a handicap of each block in the NAND memory 11 is calculated in steps S2 to S4. In step S2, a write and erase cycle test is conducted with respect to blocks provided at the same positions in the NAND memories 11. Then, in steps S3 and S4, the number of rewritable times is obtained from a result of the cycle test, i.e., a write and erase cycle number with which the life of each block is ended, and the number of rewritable times in each NAND memory 11 and the number of rewritable times in each block in the NAND memory 11 are estimated based on the numbers of rewritable times in the blocks. Furthermore, a handicap of each block is obtained from the number of rewritable times.

Subsequently, each handicap is added to the cumulative fatigue degree in the cumulative fatigue degree table 341 shown in FIG. 14 (step S5). Then, a parameter for a block to be used, i.e., a block which is a rewrite target is determined based on the cumulative fatigue degree having each handicap added thereto, and the parameter is stored (steps S6 and S7). As the parameter, use of each memory cell in the block, an interval of writes, and a write speed are decided.

Then, the block in the NAND memory 11 is used, i.e., the block in the NAND memory 11 is rewritten in accordance with the stored parameter (step S8). Moreover, a section fatigue degree is obtained based on use information of the block in step S8, and a cumulative fatigue degree is further acquired (step S9).

Then, whether a difference in cumulative fatigue degree between the blocks is not smaller than a threshold value is judged (step S10). If the difference in cumulative fatigue degree is not smaller than the threshold value, the wear leveling is executed, and the cumulative fatigue degrees of the blocks are leveled (step S11). As the wear leveling, as described above, at least one of the use of each memory cell in the block, the interval of writes, and the write speed is changed. Alternatively in the blocks having a large difference in cumulative fatigue degree, at least one of the use of each memory cell, the interval of writes, and the write speed is changed with a counterpart. Alternatively, a block having a small cumulative fatigue degree is used in a priority basis, and a block having a large fatigue degree is prevented from being used as much as possible. Thereafter, the processing returns to step S7, and processing in step S7 and subsequent steps is repeated.

On the other hand, in step S10, when the difference in cumulative fatigue degree is smaller than the threshold value, the processing returns to step S8, and the processing in step S8 and subsequent steps is repeated.

In the flowchart shown in FIG. 15, step S1 to step S6 correspond to processing executed in a test process of the NAND memory, and step S7 to step S11 correspond to processing executed at the time of actual use of the NAND memory. The test process is a process before a production version of the NAND memory, and the time of actual use is a time that the NAND memory is being used by a user after the production version of the NAND memory.

It is to be noted that the processing from step S1 to step S6 is not restricted to the test process, and it may be processing executed at the time of actual use. In this case, for example, a sample block or the like is formed in the NAND memory in advance, and the write and erase cycle test can be conducted with respect to the sample block.

As described above, according to the first and second embodiments, it is possible to provide the storage device that can use each block up to the limit of the number of rewritable times in each block in the nonvolatile memory and can efficiently use all the blocks as much as possible. It is to be noted that a target block may be a logical block or a physical block.

[Third Embodiment]

In a third embodiment, first to fourth application examples using the storage device, for example, an SSD 10 will be explained.

FIG. 16 is a perspective view showing an example of a personal computer having the SSD according to the first application example mounted therein.

A personal computer 200 includes a main body 201 and a display unit 202. The display unit 202 includes a display housing 203 and a display device 204 accommodated in this display housing 203.

The main body 201 includes a housing 205, a keyboard 206, and a touchpad 207 which is a pointing device. In the housing 205 are accommodated in a main circuit substrate, an optical disk device (ODD) unit, a card slot, and the SSD 10, and others.

The card slot is provided to be adjacent to a circumferential wall of the housing 205. An opening portion 208 facing the card slot is provided in the circumferential wall. A user can insert or remove an additional device from the outside housing 205 with respect to the card slot through the opening portion 208.

The SSD 10 may be mounted in the personal computer 200 in place of a conventional hard disk drive (HDD), or it may be used as an additional device inserted in the card slot provided in the personal computer 200.

FIG. 17 is a block diagram showing a structural example of the personal computer having the SSD according to the first application example mounted therein.

The personal computer 200 includes a CPU 301, a northbridge 302, a main memory 303, a video controller 304, an audio controller 305, a southbridge 309, a BIOS-ROM 310, the SSD 10, an ODD unit 311, an embedded controller/keyboard controller IC (EC/KBC) 312, a network controller 313, and others.

The CPU 301 is a processor provided to control an operation of the personal computer 200, and it executes an operating system (OS) loaded from the SSD 10 to the main memory 303. Furthermore, when the ODD unit 311 executes at least one of read processing and write processing with respect to a loaded optical disk, the CPU 301 executes this processing.

Moreover, the CPU 301 also executes a Basic Input/Output System (BIOS) stored in the BIOS-ROM 310. It is to be noted that BIOS is a program configured for hardware control in the personal computer 200.

The northbridge 302 is a bridge device that connects a local bus of the CPU 301 to the southbridge 309. The northbridge 302 also has a built-in memory controller that executes access control over the main memory 303.

Additionally, the northbridge 302 has a function of executing communication with the video controller 304 through an Accelerated Graphics Port (AGP) bus 314 and others and communication with the audio controller 305.

The main memory 303 temporarily stores a program or data and functions as a work area of the CPU 301. The main memory 303 is constituted of, for example, an RAM.

The video controller 304 is a video reproduction controller that controls the display unit 202 used as a display monitor of the personal computer 200.

The audio controller 305 is an audio reproduction controller that controls the speaker 306 of the personal computer 200.

The southbridge 309 controls each device on a Low Pin Count (LPC) bus and each device on a Peripheral Component Interconnect (PCI) bus 315. Additionally, the southbridge 309 controls the SSD 10, which is a storage device that stores various kinds of software and data, through an SAS interface (SAS I/F).

The personal computer 200 accesses the SSD 10 in sectors. A write command, a read command, a cache flash command, and others are input to the SSD 10 through the SAS interface.

Further, the southbridge 309 also has a function of performing access control over the BIOS-ROM 310 and the ODD unit 311.

The EC/KBC 312 is a single-chip microcomputer in which an embedded controller for power management and a keyboard controller for control over the keyboard (KB) 206 and the touchpad 207 are integrated.

This EC/KBC 312 has a function of turning on/off a power supply of the personal computer in accordance with an operation of a power button by a user. The network controller 313 is a communication device which executes communication with an external network, for example, the Internet.

As a second application example of the third embodiment, a server having the SSD mounted therein will now be described.

FIG. 18 is a conceptual view showing a use example of a server having the SSD according to the second application example mounted therein.

A server 400 is connected to the Internet 401. The SSD 10 is mounted in the server 400. Moreover, terminals, for example, computers 402 are connected to the Internet 401. A user accesses the SSD 10 in the server 400 from the computer 402 through the Internet 401. A configuration and an operation of the SSD 10 are the same as those described in the foregoing embodiments.

It is to be noted that the application target in this embodiment is not restricted to the SSD. The application target can be applied to other storage devices, for example, a Secure Digital (SD) card, a multimedia card, a USB flash memory, or an electronic device including a storage device, or any other electronic device such as a personal computer or a server.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a nonvolatile memory including blocks which store data, each of the blocks being an erase unit;
a storage unit which stores the number of writes relative to each of the blocks in the nonvolatile memory, the number of writes being the number of times that each of the blocks is written;
a storage unit which stores a handicap obtained for each of the blocks in the nonvolatile memory, the handicap being obtained by subtracting the number of writable times in each of the blocks from the number of writable times in a given block in the blocks; and
a wear leveling control unit which adds each handicap to the number of writes in each of the blocks to obtain a fatigue degree of each of the blocks, the wear leveling control unit controlling the number of writes performed with respect to each of the blocks so that the fatigue degrees are leveled, the fatigue degree representing a progress rate until each of the blocks reaches the number of writable times.

2. The storage device according to claim 1,
wherein the number of writable times is the number of writes until each of the blocks reaches a first error occurrence rate.

3. A storage device comprising:
a nonvolatile memory including blocks which store data, each of the blocks being a write and erase unit;
a data management unit which manages use information of the blocks in the nonvolatile memory;
a fatigue degree calculation unit which uses the use information managed by the data management unit to obtain a fatigue degree of each of the blocks, the fatigue degree being an amount of fatigue produced in each of the blocks when each of the blocks is used in accordance with the use information;
a fatigue degree storage unit which stores a cumulative fatigue degree acquired by cumulating the fatigue degree obtained by the fatigue degree calculation unit; and
a wear leveling control unit which controls use of the blocks based on the cumulative fatigue degree stored in the fatigue degree storage unit, the wear leveling control unit outputting the use information of the blocks to the data management unit.

4. The storage device according to claim 3, wherein the use information includes at least one of a use indicative of which one of a single-level cell storing a single bit and a multi-level cell storing multiple bits that a memory cell included in each of the blocks is used as, an interval of writes relative to each of the blocks, and a write speed with respect to each of the blocks.

5. The storage device according to claim 4, wherein the blocks include first and second blocks, and the wear leveling control unit exchanges at least one of the use, the interval of writes, and the write speed for the first and second blocks between the first and second blocks when a difference between the cumulative fatigue degrees in the first and second blocks exceeds a threshold value.

6. The storage device according to claim 3, wherein each of the blocks includes a logical blocks having physical blocks as an erase unit.

7. A storage device comprising:
a nonvolatile memory including blocks which store data, each of the blocks being a write and erase unit; and
a controller which controls an operation of the nonvolatile memory,
wherein the controller executes writes and erases with respect to a first block of the blocks in the nonvolatile memory for the first number of times during a first period, and executes writes and erases with respect to other blocks for the second number of times smaller than the first number of times during the first period.

8. The storage device according to claim 7, wherein the first block has the higher number of writable times than the other blocks.

9. The storage device according to claim 8, wherein the controller sets the number of writes until each of the blocks reaches a first error occurrence rate as the number of writable times in each of the blocks.

10. The storage device according to claim 9, wherein the first error occurrence rate includes a bit error rate (BER) which is a rate of the number of error bits with respect to first data when the first data is written into each of the blocks and the first data is read.

11. The storage device according to claim 7, wherein the controller obtains a progress rate until each of the blocks reaches the number of writable times as a fatigue degree and controls the number of writes executed to each of the blocks so that the fatigue degrees are leveled.

12. The storage device according to claim 11, where the controller raises a priority of each of the blocks having the low fatigue degree, lowers a priority of each of the blocks having the high fatigue degree, and writes the blocks.

13. The storage device according to claim 11, wherein the controller obtains the number of writable times for each of the blocks, subtracts the number of writable times for each of the blocks from the number of writable times of a given block in the blocks, and thereby acquires a handicap which is a difference between the numbers of writable times.

14. The storage device according to claim 13, wherein the controller sets the number of writes until each of the blocks reaches a first error occurrence rate as the number of writable times in each of the blocks.

15. The storage device according to claim 14, wherein the first error occurrence rate includes a bit error rate (BER) which is a rate of the number of error bits with respect to first data when the first data is written into each of the blocks and the first data is read.

16. The storage device according to claim 13, further comprising:
a storage unit which stores a table in which the numbers of writes are stored; and
a storage unit which stores a table in which the handicaps are stored.

17. The storage device according to claim 7, the blocks includes the first block and the second block, the controller obtains the numbers of writable times for the first block and the second block, and the number of writable times for the first block is higher than the number of writable times for the second block.

18. The storage device according to claim 7, wherein each of the blocks includes a logical block including physical blocks as an erase unit, and the physical blocks included in the logical block have the numbers of writable times which are similar to each other.

19. The storage device according to claim 18, wherein the controller performs writes in units of the logical block.

20. The storage device according to claim 7, wherein the storage device includes a solid-state drive (SSD).

* * * * *